United States Patent
Katsuta et al.

(10) Patent No.: US 12,292,658 B2
(45) Date of Patent: May 6, 2025

(54) DISPLAY DEVICE

(71) Applicant: Japan Display Inc., Tokyo (JP)

(72) Inventors: Tadayoshi Katsuta, Tokyo (JP);
Shunsuke Noichi, Tokyo (JP);
Yasuyuki Teranishi, Tokyo (JP);
Satoshi Uchino, Tokyo (JP); Hayato Kurasawa, Tokyo (JP); Yoshiharu Nakajima, Tokyo (JP)

(73) Assignee: Japan Display Inc., Tokyo (JP)

( * ) Notice: Subject to any disclaimer, the term of this patent is extended or adjusted under 35 U.S.C. 154(b) by 639 days.

(21) Appl. No.: 17/221,089

(22) Filed: Apr. 2, 2021

(65) Prior Publication Data

US 2021/0223598 A1 Jul. 22, 2021

Related U.S. Application Data

(63) Continuation of application No. PCT/JP2019/033996, filed on Aug. 29, 2019.

(30) Foreign Application Priority Data

Oct. 5, 2018 (JP) ................................ 2018-190080

(51) Int. Cl.
*H10D 30/67* (2025.01)
*G02F 1/1343* (2006.01)
(Continued)

(52) U.S. Cl.
CPC .... *G02F 1/13452* (2013.01); *G02F 1/134309* (2013.01); *G02F 1/13456* (2021.01);
(Continued)

(58) Field of Classification Search
CPC ............ G02F 1/13452; G02F 1/13456; G02F 1/134309; G02F 1/136209; G02F 1/1368; H01L 27/124; H01L 29/78633
See application file for complete search history.

(56) References Cited

U.S. PATENT DOCUMENTS 9,921,613 B2 3/2018 Kuramochi
2003/0043331 A1* 3/2003 Oowaki .............. G02F 1/13452
349/151

(Continued)

FOREIGN PATENT DOCUMENTS

JP 2008-015507 A 1/2008
JP 2014-052546 A 3/2014
(Continued)

OTHER PUBLICATIONS

International Search Report issued in International Patent Application No. PCT/JP2019/033996 on Nov. 26, 2019 and English translation of same. 6 pages.

(Continued)

*Primary Examiner* — Shaun M Campbell
(74) *Attorney, Agent, or Firm* — K&L Gates LLP

(57) ABSTRACT

A display device includes a display region having a plurality of pixels, a driver IC provided in a frame region on an outer side of the display region and configured to drive the pixels, a first power source wiring line and a second power source wiring line each electrically coupled to the driver IC, and a first electrode that is arranged so as to face the first power source wiring line and the second power source wiring line via a first insulating layer, and is electrically coupled to the first power source wiring line.

12 Claims, 15 Drawing Sheets

(51) Int. Cl.
    *G02F 1/1345*    (2006.01)
    *G02F 1/1362*    (2006.01)
    *G02F 1/1368*    (2006.01)
    *H10D 86/40*    (2025.01)
    *H10D 86/60*    (2025.01)

(52) U.S. Cl.
    CPC ...... *G02F 1/136209* (2013.01); *G02F 1/1368* (2013.01); *H10D 30/6723* (2025.01); *H10D 86/441* (2025.01); *H10D 86/60* (2025.01)

(56) References Cited

U.S. PATENT DOCUMENTS

| | | |
|---|---|---|
| 2008/0001892 A1 | 1/2008 | Kim et al. |
| 2014/0071389 A1 | 3/2014 | Daishi et al. |
| 2016/0056222 A1 | 2/2016 | Odaka et al. |
| 2016/0370674 A1* | 12/2016 | Koo ................ G02F 1/136286 |
| 2017/0278469 A1* | 9/2017 | Iwami .................. G09G 3/3611 |
| 2017/0357353 A1* | 12/2017 | Katsuta .............. G06F 3/04164 |
| 2017/0365650 A1 | 12/2017 | Kwon et al. |
| 2018/0063970 A1* | 3/2018 | Ha ...................... G02F 1/13458 |
| 2018/0108310 A1* | 4/2018 | Dong ................... G02F 1/13452 |
| 2018/0315885 A1* | 11/2018 | Jeon ................... H01L 29/78633 |
| 2020/0295053 A1* | 9/2020 | Yamarin ............. H01L 27/1225 |

FOREIGN PATENT DOCUMENTS

| | | |
|---|---|---|
| JP | 2016-045371 A | 4/2016 |
| JP | 2016-109927 A | 6/2016 |
| JP | 2017-215012 | 12/2017 |

OTHER PUBLICATIONS

International Written Opinion issued in International Patent Application No. PCT/JP2019/033996 on Nov. 26, 2019. 4 pages.

Office Action issued in related Japanese Patent Application No. 2018-190080 mailed on Feb. 1, 2022 and Englsih translation of same. 6 pages.

\* cited by examiner

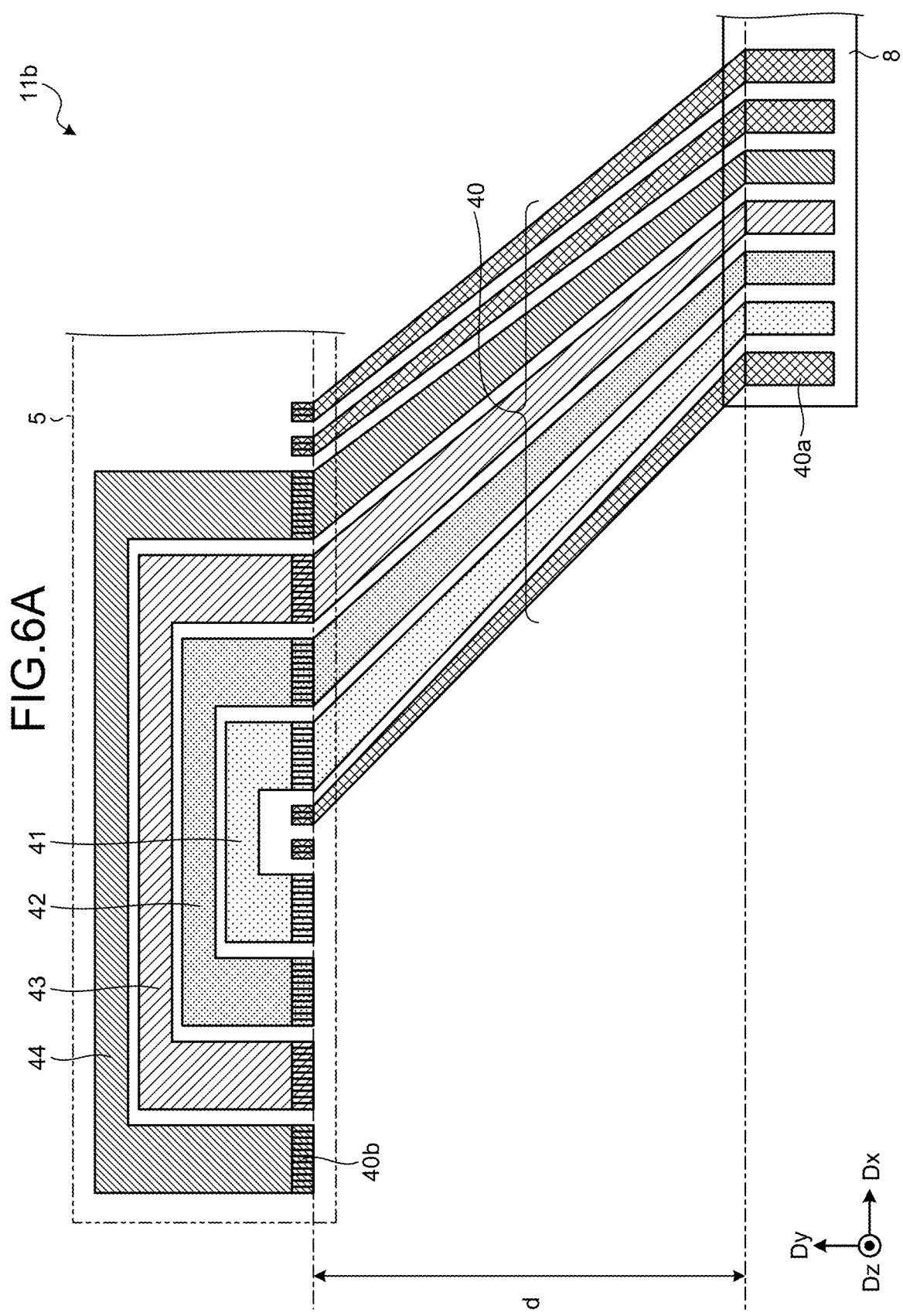

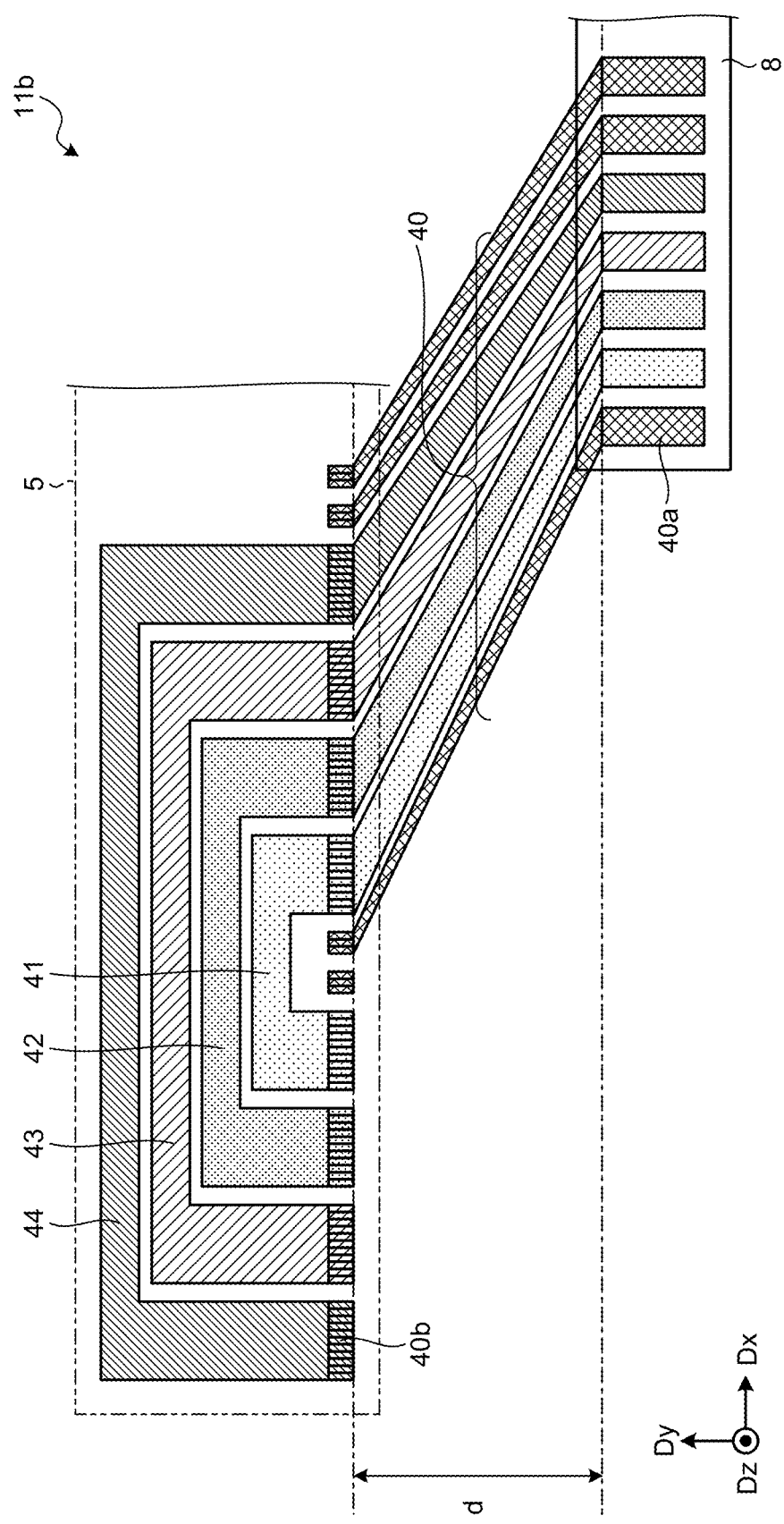

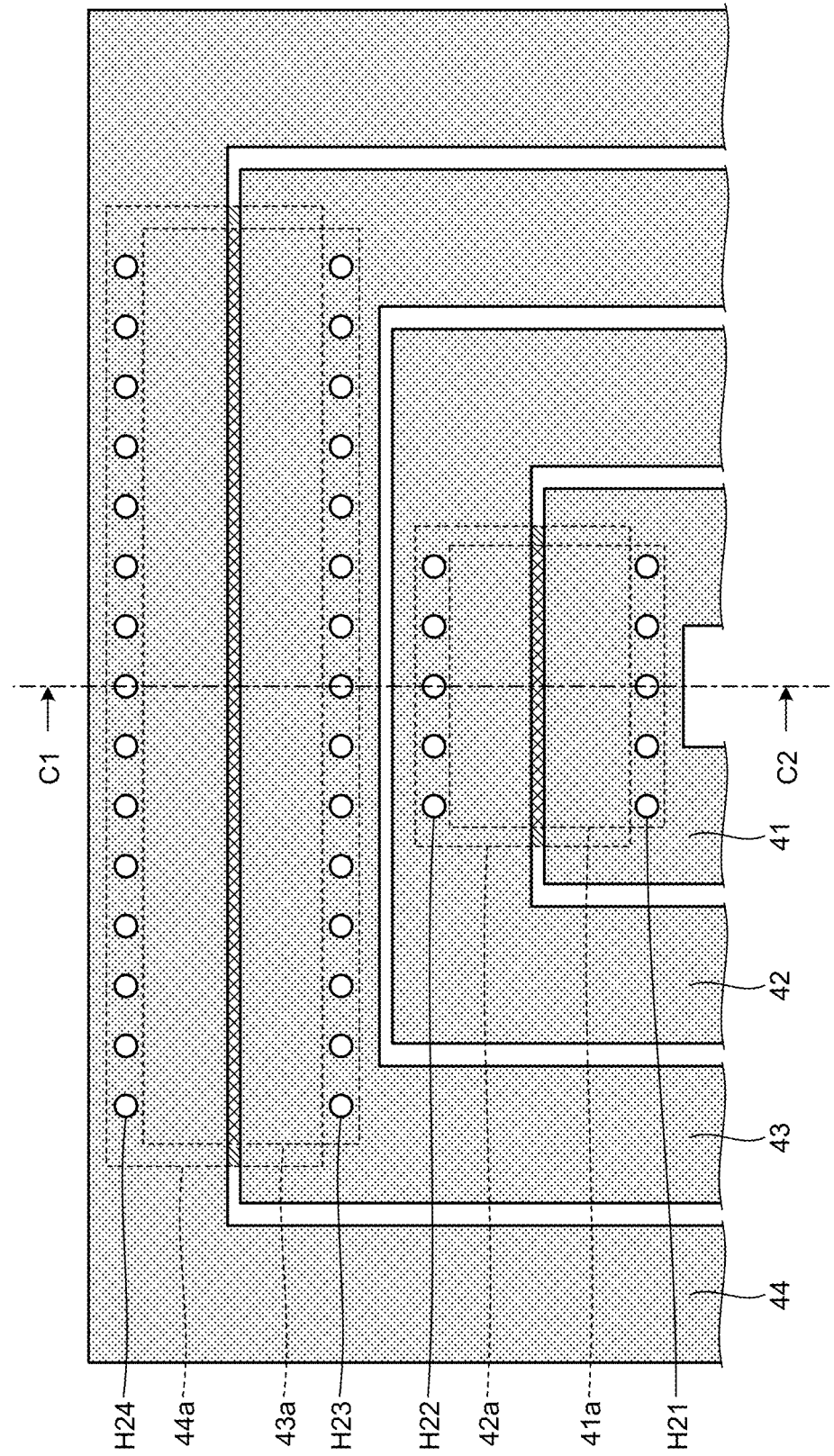

DISPLAY DEVICE

CROSS-REFERENCE TO RELATED APPLICATION

This application is a continuation of PCT international application Ser. No. PCT/JP2019/033996 filed on Aug. 29, 2019 which designates the United States, incorporated herein by reference, and which claims the benefit of priority from Japanese Patent Application No. 2018-190080 filed on Oct. 5, 2018, incorporated herein by reference.

BACKGROUND

1. Technical Field

The present disclosure relates to a display device.

2. Description of the Related Art

Apparatuses such as a laptop personal computer generally have the configuration in which two casings are physically coupled so as to be opened and closed. In the apparatuses having such a configuration, biaxial hinges can be provided on both ends of a side along which the two casings are physically coupled (for example, Japanese Patent Application Laid-open Publication No. 2017-215012).

In general, in the above-mentioned configuration, wiring lines between a display panel provided on one casing and a circuit substrate provided on the other casing are coupled through flexible printed circuits provided between the hinges. In such a configuration, a width for providing the flexible printed circuits is restricted by the widths of the hinges. On the other hand, what is called frame narrowing, which is narrowing a frame region located at the outer circumference of a display region, has been desired in the above-mentioned apparatuses. The wiring lines on the display panel side that extend from the flexible printed circuits may be made thinner as the frame is narrowed. In particular, when a power source wiring line is made thinner and a resistance value increases, a power source voltage becomes unstable due to instantaneous fluctuation in a current amount to cause malfunctions and display image failures in some cases.

An object of the present disclosure is to provide a display device capable of making a power source voltage stable.

SUMMARY

A display device according to an embodiment of the present disclosure includes a display region having a plurality of pixels, a driver IC provided in a frame region on an outer side of the display region and configured to drive the pixels, a first power source wiring line and a second power source wiring line each electrically coupled to the driver IC, and a first electrode that is arranged so as to face the first power source wiring line and the second power source wiring line via a first insulating layer, and is electrically coupled to the first power source wiring line.

BRIEF DESCRIPTION OF THE DRAWINGS

FIG. 6A is an enlarged view of a region B illustrated in FIG. 1;

FIG. 6B is an enlarged view of the region B illustrated in FIG. 1;

FIG. 7 is a plan view illustrating an example of a power source wiring unit in the first embodiment;

DETAILED DESCRIPTION

Figure 1:
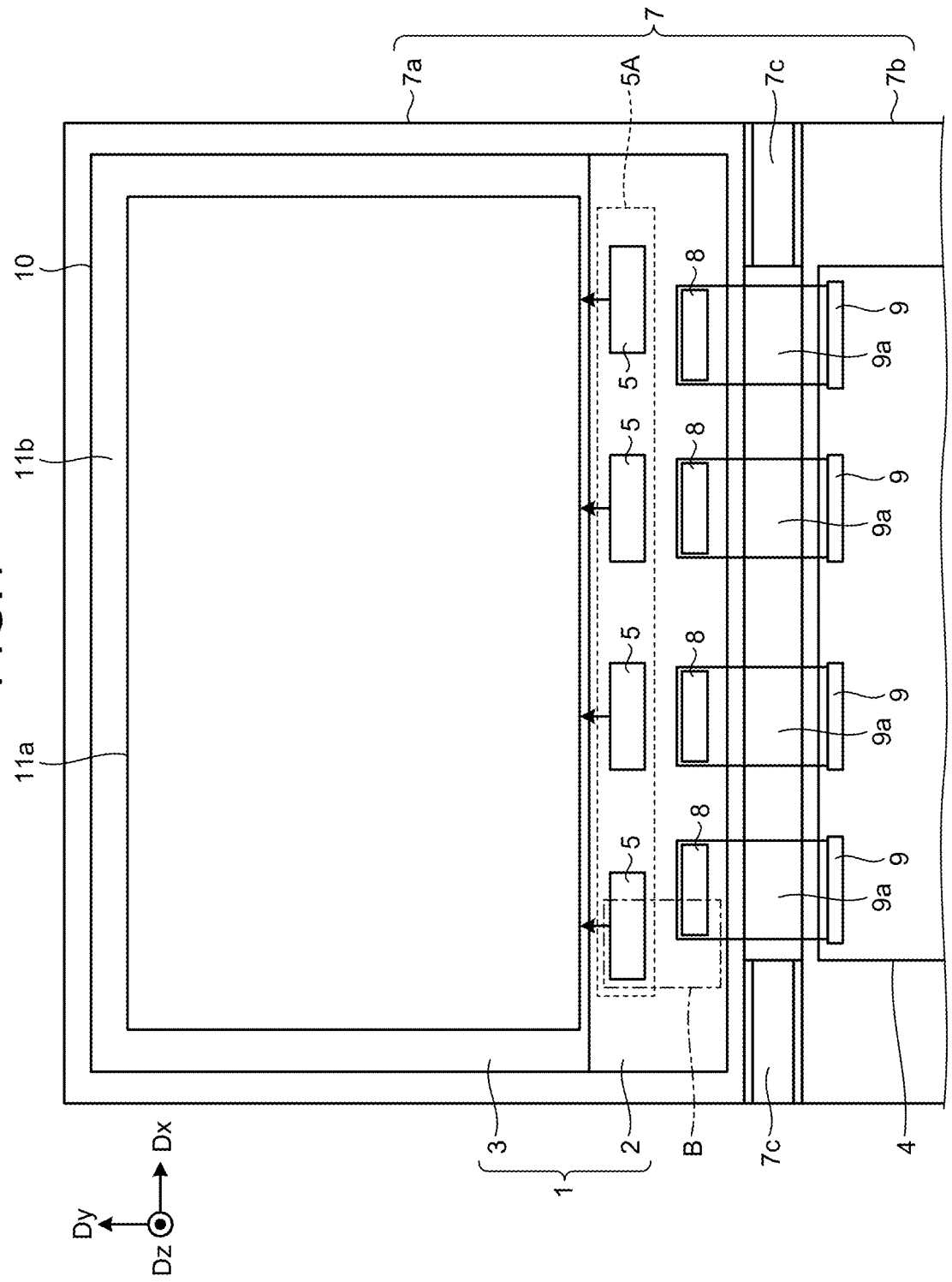
FIG. 1 is a schematic view illustrating the schematic configuration of a display device according to a first embodiment.

Modes for carrying out the present disclosure (embodiments) will be described in detail with reference to the drawings. Contents described in the following embodiments do not limit the present disclosure. Component elements described below include those that can be easily assumed by those skilled in the art and substantially the same components. Furthermore, the component elements described below can be appropriately combined. What is disclosed herein is merely an example, and it is needless to say that appropriate modifications within the gist of the disclosure at which those skilled in the art can easily arrive are encompassed in the range of the present disclosure. In the drawings, widths, thicknesses, shapes, and the like of the components can be schematically illustrated in comparison with actual modes for clearer explanation. They are, however, merely examples and do not limit interpretation of the present disclosure. In the present specification and the drawings, the same reference numerals denote elements similar to those described before with reference to the drawing that has already been referred to, and detail explanation thereof can be appropriately omitted.

First Embodiment

Figure 2:
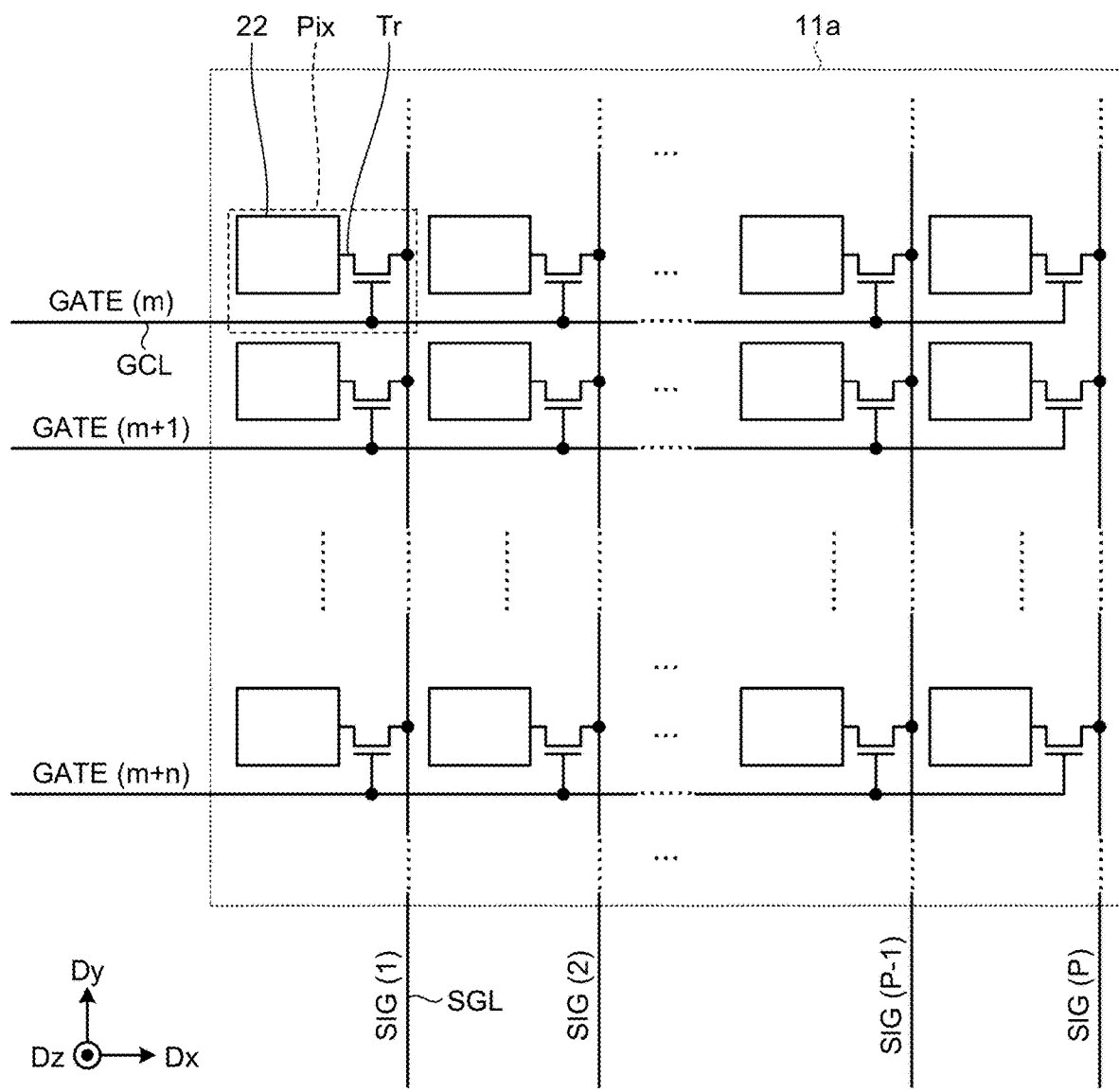
FIG. 2 is a view illustrating an example of pixel array in a display region.

FIG. 1 is a schematic view illustrating the schematic configuration of a display device according to a first embodiment. FIG. 2 is a view illustrating an example of pixel array in a display region.

A display device 1 is used as a display unit of a laptop personal computer 7, for example, in the embodiment. The personal computer 7 includes a first casing 7a and a second casing 7b provided so as to be opened and closed with hinge portions 7c. The display device 1 in the embodiment is incorporated in the first casing 7a.

Figure 3:
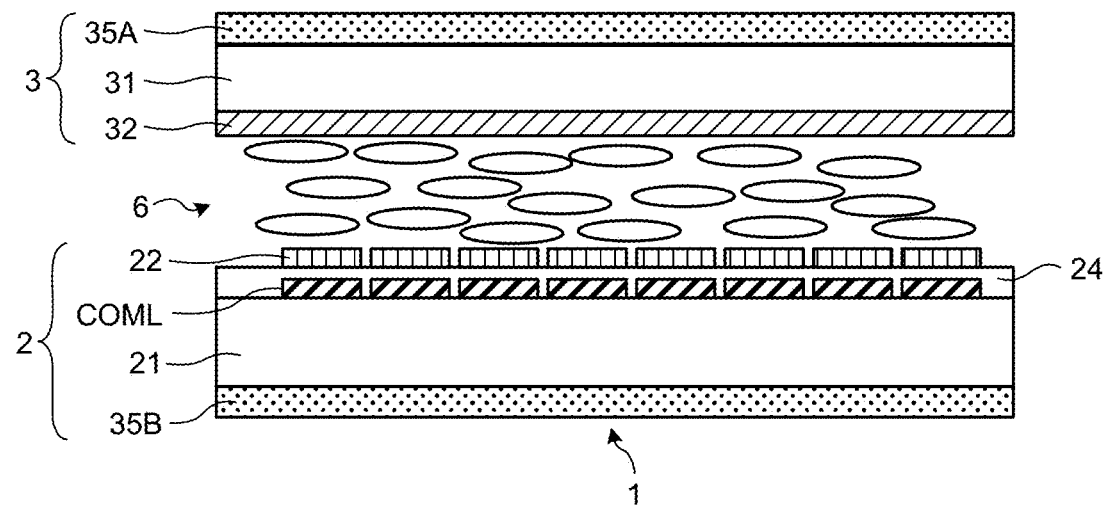
FIG. 3 is a sectional view illustrating the schematic sectional configuration of the display device.

As illustrated in FIG. 1, the display device 1 in the embodiment includes a display panel 10 having a display region 11a and a plurality of flexible printed circuits 9a mounted on one side of the display panel 10. As illustrated in FIG. 2, a plurality of pixels Pix arrayed in a Dx direction (first direction) and a Dy direction (second direction) in the drawing are provided in the display region 11a. The display region 11a has upper and lower sides extending in the Dx direction and right and left sides extending in the Dy direction orthogonal to the Dx direction. Although FIG. 2 illustrates some pixels Pix, the pixels Pix are arranged over the entire area of the display region 11a. As illustrated in FIG. 3, the display panel 10 includes an array substrate 2, a counter substrate 3 arranged so as to face the surface of the array substrate 2 in the perpendicular direction, and a liquid crystal layer 6 (see FIG. 3) provided between the array substrate 2 and the counter substrate 3.

Although the configuration using a liquid crystal display element as a display element is employed as an example in the embodiment, for example, an organic light emitting diode or a micro light emitting diode (micro LED) may be included as the display element. The mode of the display element does not limit the present disclosure.

As illustrated in FIG. 2, gate lines GCL for supplying scan signals (gate signals) GATE ( . . . , m, m+1, . . . m+n, . . . ) to the pixels Pix and signal lines SGL for supplying pixel signals SIG (1, 2, . . . , P) to the pixels Pix are provided in the display region 11a. The gate lines GCL are provided to extend in the Dx direction in the embodiment. The signal lines SGL are provided to extend in the Dy direction in the embodiment.

Each pixel Pix includes a pixel electrode 22 and a pixel transistor Tr. The pixel transistor Tr is formed by a thin film transistor and is configured by, for example, an n-channel metal oxide semiconductor (MOS)-type TFT. The source of the pixel transistor Tr is coupled to the signal line SGL, the gate thereof is coupled to the gate line GCL, and the drain thereof is coupled to the pixel electrode 22.

As illustrated in FIG. 1, a drive circuit unit 5A is provided in a frame region 11b on the outer side of the display region 11a. The drive circuit unit 5A includes a plurality of driver ICs 5 mounted on the array substrate 2. The driver ICs 5 corresponding to a plurality of regions divided in the horizontal direction, respectively, are provided in the example illustrated in FIG. 1. The driver ICs 5 are semiconductor chips in which signal line drive circuits and the like are integrated, and, for example, the pixel signals SIG to be supplied to the signal lines SGL are generated in the driver ICs 5. The driver ICs 5 are mounted side by side with predetermined intervals along the Dx direction.

Although four driver ICs 5 are provided in the example illustrated in FIG. 1, one, two, or equal to or more than four driver ICs 5 may be provided. The number of driver ICs 5 does not limit the present disclosure.

For example, a gate driver (not illustrated) generating the scan signals (gate signals) GATE is formed on the array substrate 2.

A circuit substrate 4 is incorporated in the second casing 7b. The circuit substrate 4 is, for example, a rigid substrate such as a printed circuit board (PCB). For example, circuit components such as a power source circuit generating various reference potentials, a signal processing circuit processing video image signals, and a frame memory can be arranged on the circuit substrate 4.

A plurality of terminal portions 8 for coupling to the wiring lines on the circuit substrate 4 side are provided at positions separated from the driver ICs 5 in the Dy direction on an end portion of the array substrate 2. The driver ICs 5 and the terminal portions 8 correspond to each other one-to-one in the embodiment. The terminal portions 8 are provided on the array substrate 2 with predetermined intervals along the Dx direction. Connectors 9 for coupling to the wiring lines on the display panel 10 side are provided on an end portion of the circuit substrate 4. The terminal portions 8 on the array substrate 2 and the connectors 9 on the circuit substrate 4 are coupled to each other with the flexible printed circuits (FPC) 9a. The flexible printed circuits 9a are made to adhere to the display panel 10 through, for example, an ACF on the terminal portions 8.

Figure 4:
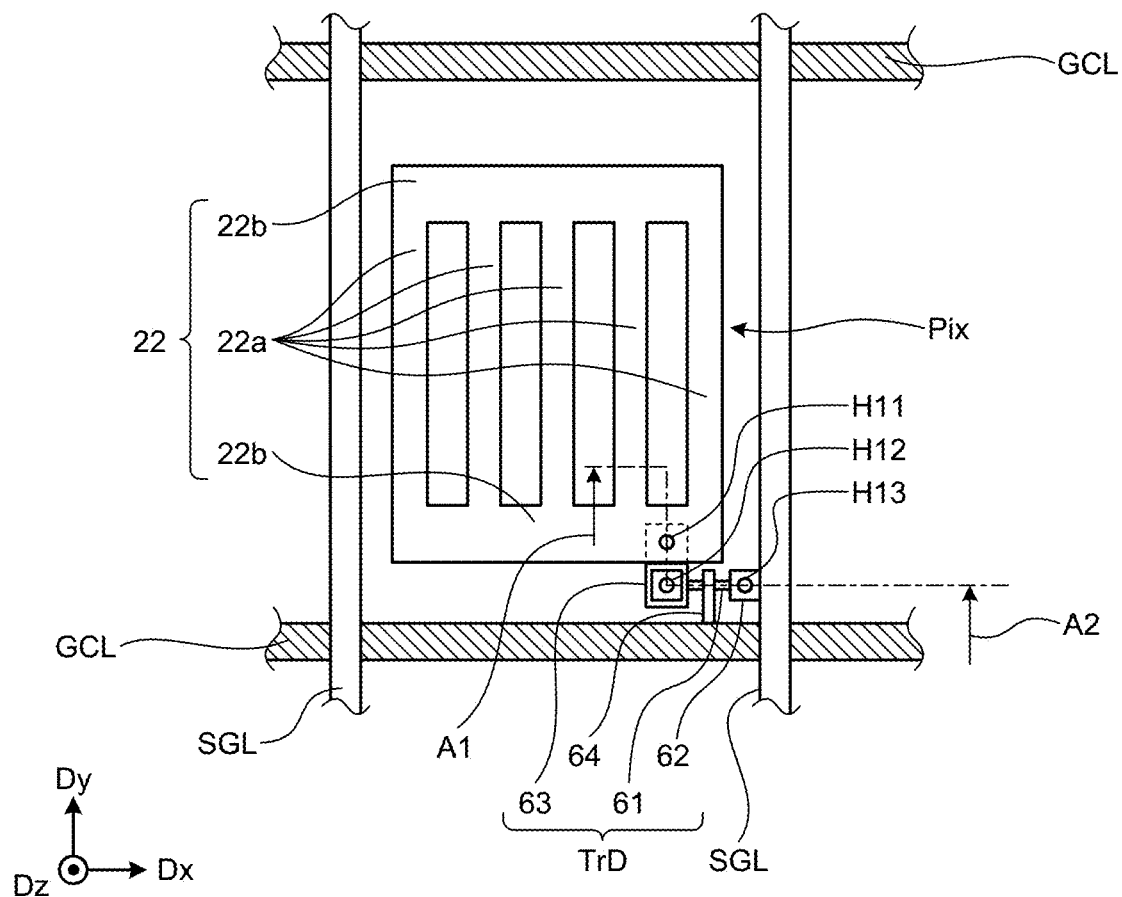
FIG. 4 is a plan view illustrating an example of the configuration of a pixel.
Figure 5:
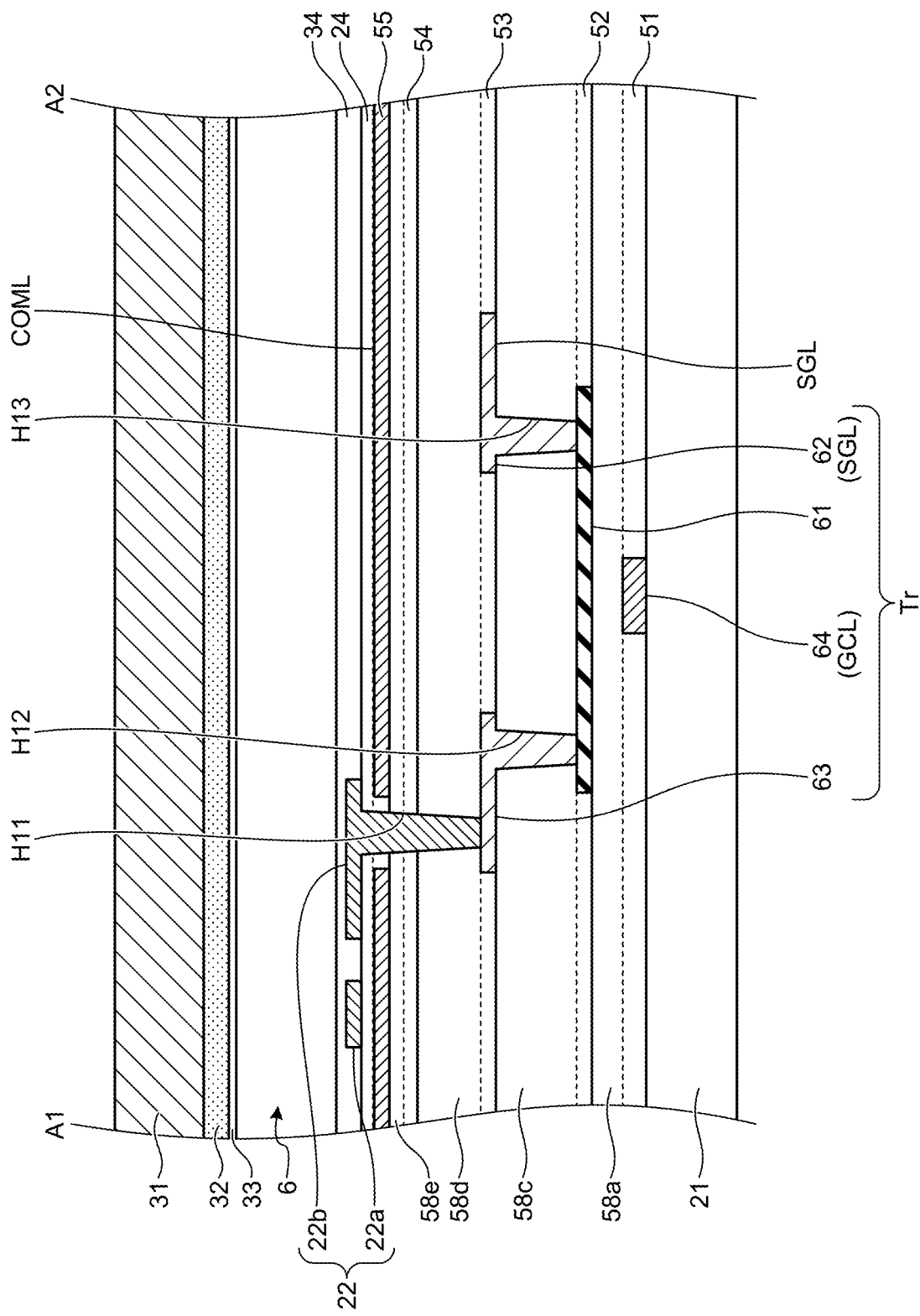
FIG. 5 is a sectional view cut along line A1-A2 in FIG. 4.

Next, the schematic configuration of the display device 1 in the first embodiment will be described with reference to FIG. 3 to FIG. 5. FIG. 3 is a sectional view illustrating the schematic sectional configuration of the display device. FIG. 4 is a plan view illustrating an example of the configuration of the pixel. FIG. 5 is a sectional view cut along line A1-A2 in FIG. 4.

As illustrated in FIG. 3, the array substrate 2 includes a first substrate 21 made of glass or transparent resin, the pixel electrodes 22, common electrodes COML, and an insulating layer 24 insulating the pixel electrodes 22 and the common electrodes COML. The pixel electrodes 22 are arrayed in a matrix with a row-column configuration, for example, above the first substrate 21. The common electrodes COML are provided between the first substrate 21 and the pixel electrodes 22.

The pixel electrodes 22 and the common electrodes COML are made of, for example, a conductive material having translucency, such as indium tin oxide (ITO). A polarizing plate 35B is provided under the first substrate 21 with an adhesion layer (not illustrated) interposed therebetween.

The counter substrate 3 includes a second substrate 31 made of glass or transparent resin and a color filter 32 and a light shielding layer (not illustrated) formed on one surface of the second substrate 31. A polarizing plate 35A is provided above the second substrate with an adhesion layer (not illustrated) interposed therebetween.

The array substrate 2 and the counter substrate 3 are arranged so as to face each other with a predetermined interval (cell gap) therebetween. The liquid crystal layer 6 as a display function layer is provided in a space between the first substrate 21 and the second substrate 31. The liquid crystal layer 6 modulates light that passes therethrough in accordance with an electric field state, and, for example, liquid crystal appropriate for a transverse electric field mode such as in-plane switching (IPS) including fringe field switching (FFS) is used therefor.

The array substrate 2 includes the pixel transistors Tr of the pixels Pix, the signal lines SGL for supplying the pixel signals SIG to the pixel electrodes 22, the gate lines GCL for supplying the gate signals GATE driving the pixel transistors Tr, and other wiring lines. The signal lines SGL and the gate lines GCL extend in a plane parallel to the surface of the first substrate 21.

As illustrated in FIG. 4, regions surrounded by the gate lines GCL and the signal lines SGL are the pixels Pix. Each pixel electrode 22 has a plurality of band-like electrodes 22a and connection portions 22b.

As illustrated in FIG. 4, each pixel transistor Tr includes a semiconductor 61, a source electrode 62, a drain electrode 63, and a gate electrode 64.

As illustrated in FIG. 5, a gate line layer 51 is provided above the first substrate 21. The gate electrodes 64 (gate lines GCL) are provided in the gate line layer 51. An insulating layer 58a (second insulating layer) covers the gate electrodes 64 and is provided above the first substrate 21. A semiconductor layer 52 is provided above the insulating layer 58a. The semiconductors 61 are provided in the semiconductor layer 52. A signal line layer 53 is provided above the semiconductor layer 52 with an insulating layer 58c (first insulating layer) interposed therebetween. The drain electrodes 63 and the source electrodes 62 (signal lines SGL) are provided in the signal line layer 53. An auxiliary wiring layer 54 is provided above the drain electrodes 63 and the source electrodes 62 (signal lines SGL) with an insulating layer 58d (third insulating layer) interposed therebetween. A common electrode layer 55 is provided above the auxiliary wiring layer 54 with an insulating layer 58e interposed therebetween. The common electrodes COML are provided in the common electrode layer 55. The configuration in which the auxiliary wiring layer and the common electrode layer overlap with each other with no insulating layer interposed therebetween can also be employed. The pixel electrodes 22 are provided above the common electrode layer 55 with the insulating layer 24 interposed therebetween.

As illustrated in FIG. 4 and FIG. 5, the pixel electrodes 22 are coupled to the drain electrodes 63 of the pixel transistors Tr through contact holes H11. The drain electrodes 63 are coupled to the semiconductors 61 through contact holes H12. The semiconductors 61 intersect with the gate electrodes 64 when seen from above. The gate electrodes 64 are coupled to the gate lines GCL and are provided so as to project from one sides of the gate lines GCL. The semiconductors 61 extend to positions overlapping with the source electrodes 62 and are electrically coupled to the source electrodes 62 through contact holes H13. The source electrodes 62 are coupled to the signal lines SGL and project from one side of the signal lines SGL.

A well-known material such as polysilicon and oxide semiconductor can be used as a material of the semiconductors 61. For example, use of transparent amorphous oxide semiconductor (TAOS) can achieve excellent ability to retain a voltage for video image display for a long period of time (retention rate) and improve display quality.

The gate electrodes 64 (gate lines GCL) are made of, for example, aluminum (Al), copper (Cu), silver (Ag), molybdenum (Mo), or an alloy thereof. The drain electrodes 63 and the source electrodes 62 (signal lines SGL) are made of, for example, titanium aluminum (TiAl) as an alloy of titanium and aluminum.

Well-known insulating materials can be used as materials of the insulating layers 24, 58a, 58c, 58d, and 58e. For example, tetra ethyl ortho silicate (TEOS) can be used as a material of an insulating layer 58b. For example, a silicon oxide film ($SiO_2$) can be used as the material of the insulating layer 58c.

Similarly to the gate electrodes 64 (gate lines GCL), the auxiliary wiring layer 54 is made of, for example, aluminum (Al), copper (Cu), silver (Ag), molybdenum (Mo), or an alloy thereof, as a material.

As illustrated in FIG. 1, the first casing 7a and the second casing 7b can be opened and closed with the hinge portions 7c in the embodiment. A width (width in the Dx direction in the drawing) for providing the flexible printed circuits 9a is therefore restricted by the hinge portions 7c. In such a configuration, the terminal portions 8 can be arranged so as to deviate from the corresponding driver ICs 5 in the Dx direction. FIG. 1 illustrates an example in which two terminal portions 8 provided at both ends are arranged so as to deviate from the corresponding driver ICs 5 in the Dx direction. On the other hand, positions of the two terminal portions 8 provided in the vicinity of the center are identical to those of the corresponding drivers IC 5 in the Dx direction. As will be described in detail later, a positive power source VDD and a negative power source VSS for a logic circuit and a positive power source AVDD and a negative power source AVSS for an analog circuit are supplied to each driver IC 5 from the circuit substrate 4 through the connector 9, the flexible printed circuit 9a, and the terminal portion 8 in the embodiment. Hereinafter, supply paths of the power sources will be described with reference to FIG. 6A and FIG. 6B.

FIG. 6A and FIG. 6B are enlarged views of a region B illustrated in FIG. 1. FIG. 6A and FIG. 6B illustrate an example in which a plurality of first pads 40b on which the driver IC 5 is mounted are aligned side by side in the Dx direction, a plurality of second pads 40a configuring the terminal portion 8 are aligned side by side in the Dx direction, and the first pads 40b and the second pads 40a are arranged to be separated from each other by a distance d in the Dy direction. The first pads 40b are provided at positions on which the driver IC 5 overlaps, and each of them is coupled to the driver IC 5.

In the example illustrated in FIG. 6A and FIG. 6B, a power source wiring line 41 supplies the positive power source VDD for the logic circuit. A power source wiring line 42 supplies the negative power source VSS for the logic circuit. A power source wiring line 43 supplies the positive power source AVDD for the analog circuit. A power source wiring line 44 supplies the negative power source AVSS for the analog circuit. The power source wiring lines 41, 42, 43, and 44 are provided in a region overlapping with the driver IC 5. In the example illustrated in FIG. 6A and FIG. 6B, each wiring line between the second pad 40a and the first pad 40b is a "wiring line 40". The driver IC 5 has input parts of two systems. Each of the input parts is arranged along an end portion of the driver IC 5 in the Dx direction. Each of the power source wiring lines 41, 42, 43, and 44 couples the input parts of the two systems. Each of the power source wiring lines 41, 42, 43, and 44 is coupled to the wiring line 40 through one of the input parts of the two systems. Each of widths of the power source wiring lines 41, 42, 43, and 44 is greater than each of widths of the wiring lines 40. The second pads 40a and the first pads 40b are coupled to each other through the wiring lines 40 in a correspondence manner. The example illustrated in FIG. 6A and the example illustrated in FIG. 6B are different from each other in the distance d between the second pads 40a and the first pads 40b in the Dy direction.

When the terminal portions 8 and the driver ICs 5 are arranged in staggered manner in the Dx direction as illustrated in FIG. 1, the widths of the wiring lines 40 between the second pads 40a and the first pads 40b are decreased as illustrated in FIG. 6A and FIG. 6B. In particular, when the distance d between the second pads 40a and the first pads 40b in the Dy direction is decreased as illustrated in FIG. 6B, the widths of the wiring lines 40 are smaller than those in the example illustrated in FIG. 6A, which causes the wiring to increase wiring resistance. Especially, when the wiring resistances of the wiring lines 40 coupled to the power source wiring lines 41, 42, 43, and 44 increase, the power source voltage is lowered due to instantaneous increase of a load current in the driver IC 5, which may cause malfunctions of the driver IC 5 and display image failures.

Figure 8:
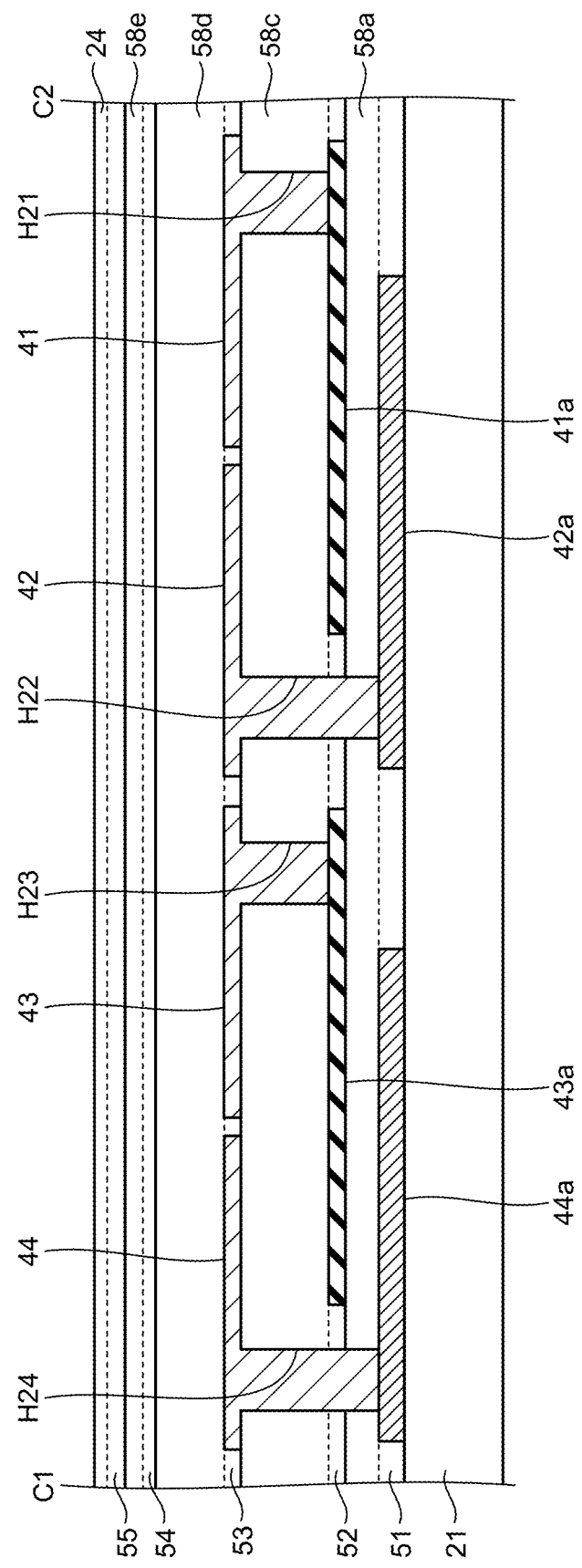
FIG. 8 is a sectional view cut along line C1-C2 in FIG. 7.
Figure 9:
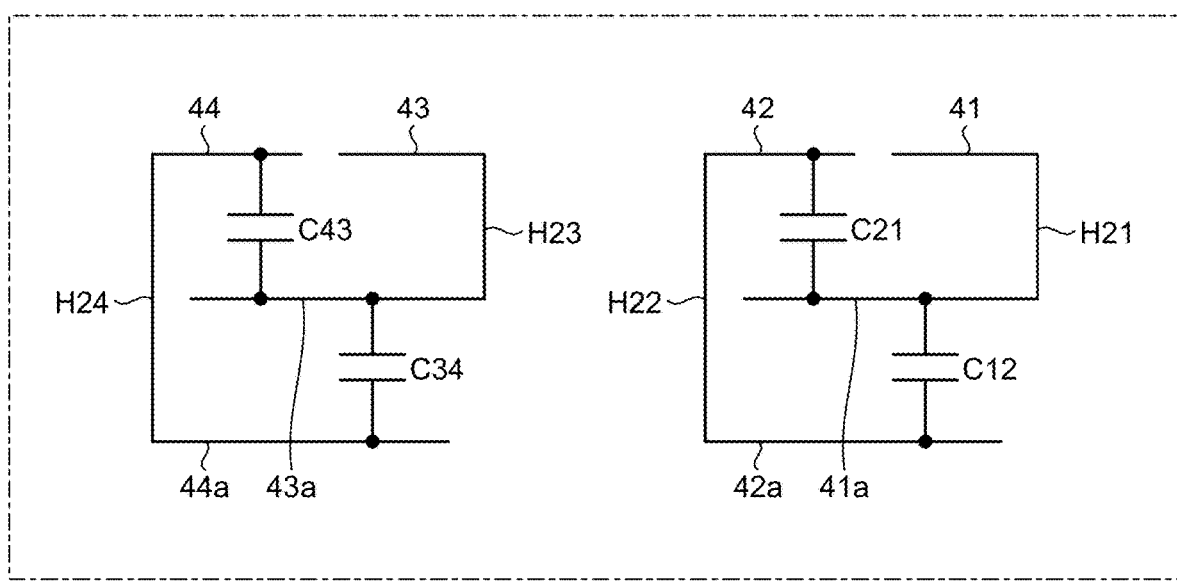
FIG. 9 is an equivalent circuit diagram of the power source wiring unit illustrated in FIG. 7.

When the distance d between the second pads 40a and the first pads 40b in the Dy direction is increased as illustrated in FIG. 6A, the wiring resistances can be decreased, thereby reducing the malfunctions of the driver IC 5 and the display image failures. It is, however, difficult to achieve narrowing of the frame region 11b in the Dy direction in this case. To be specific, the frame narrowing of a lower side portion of the display panel 10 is attempted by making the distance d between the second pads 40a and the first pads 40b corresponding to each other in the Dy direction smaller than a distance between the second pads 40a and the first pads 40b in the Dx direction. FIG. 7 is a plan view illustrating an example of a power source wiring unit in the first embodiment. FIG. 8 is a sectional view cut along line C1-C2 in FIG. 7. FIG. 9 is an equivalent circuit diagram of the power source wiring unit illustrated in FIG. 7.

First, a relation between the positive power source VDD and the negative power source VSS for the logic circuit will be described.

As illustrated in FIG. 8, the power source wiring line 41 (first power source wiring line) for supplying the positive power source VDD for the logic circuit to the driver IC 5 and the power source wiring line 42 (second power source wiring line) for supplying the negative power source VSS for the logic circuit to the driver IC 5 are provided in the signal line layer 53.

As illustrated in FIG. 8, a first electrode 41a arranged so as to face the power source wiring line 41 (first power source wiring line) and the power source wiring line 42 (second power source wiring line) with the insulating layer 58c (first insulating layer) interposed therebetween is provided in the semiconductor layer 52, and a second electrode 42a arranged so as to face the first electrode 41a with the insulating layer 58a (second insulating layer) interposed therebetween is provided in the gate line layer 51. The first electrode 41a and the second electrode 42a are provided in regions overlapping with the driver IC 5.

As illustrated in FIG. 7 and FIG. 8, the first electrode 41a is coupled to the power source wiring line 41 (first power source wiring line) through contact holes H21. An electrostatic capacitance C21 is thereby provided in a region in which the power source wiring line 42 (second power source wiring line) and the first electrode 41a overlap with each other, as illustrated in FIG. 9.

As illustrated in FIG. 7 and FIG. 8, the second electrode 42a is coupled to the power source wiring line 42 (second power source wiring line) through contact holes H22. An electrostatic capacitance C12 is thereby provided in a region in which the first electrode 41a and the second electrode 42a overlap with each other, as illustrated in FIG. 9.

With the above-mentioned configuration, a combined electrostatic capacitance of the electrostatic capacitance C21 and the electrostatic capacitance C12 is provided between the positive power source VDD and the negative power source VSS for the logic circuit. Supply of electric charges can thereby be mutually compensated between the positive power source VDD and the negative power source VSS for the logic circuit.

A mode in which the second electrode 42a is not configured in the gate line layer 51 may be employed. In this case, the electrostatic capacitance C21 provided in the region in which the power source wiring line 42 (second power source wiring line) and the first electrode 41a overlap with each other can compensate for the supply of the electric charges mutually between the positive power source VDD and the negative power source VSS for the logic circuit. The structural positional relation between the positive power source VDD and the negative power source VSS for the logic circuit is not limited to the mode illustrated in FIGS. 7, 8, and 9, and the structural positional relation between the positive power source VDD and the negative power source VSS for the logic circuit may be reversed.

Voltage fluctuation of the positive power source VDD and the negative power source VSS for the logic circuit can thereby be reduced.

Then, a relation between the positive power source AVDD and the negative power source AVSS for the analog circuit will be described.

As illustrated in FIG. 8, the power source wiring line 43 (first power source wiring line) for supplying the positive power source AVDD for the analog circuit to the driver IC 5 and the power source wiring line 44 (second power source wiring line) for supplying the negative power source AVSS for the analog circuit to the driver IC 5 are provided in the signal line layer 53.

As illustrated in FIG. 8, a first electrode 43a arranged so as to face the power source wiring line 43 (first power source wiring line) and the power source wiring line 44 (second power source wiring line) with the insulating layer 58c (first insulating layer) interposed therebetween is provided in the semiconductor layer 52, and a second electrode 44a arranged so as to face the first electrode 43a with the insulating layer 58a (second insulating layer) interposed therebetween is provided in the gate line layer 51. The first electrode 43a and the second electrode 44a are provided in regions overlapping with the driver IC 5.

As illustrated in FIG. 7 and FIG. 8, the first electrode 43a is coupled to the power source wiring line 43 (first power source wiring line) through contact holes H23. An electrostatic capacitance C43 is thereby provided in a region in which the power source wiring line 44 (second power source wiring line) and the first electrode 43a overlap with each other, as illustrated in FIG. 9.

As illustrated in FIG. 7 and FIG. 8, the second electrode 44a is coupled to the power source wiring line 44 (second power source wiring line) through contact holes H24. An electrostatic capacitance C34 is thereby provided in a region in which the first electrode 43a and the second electrode 44a overlap with each other, as illustrated in FIG. 9.

With the above-mentioned configuration, a combined electrostatic capacitance of the electrostatic capacitance C43 and the electrostatic capacitance C34 is provided between the positive power source AVDD and the negative power source AVSS for the analog circuit. Supply of electric charges can thereby be mutually compensated between the positive power source AVDD and the negative power source AVSS for the analog circuit.

A mode in which the second electrode 44a is not configured in the gate line layer 51 may be employed. In this case, the electrostatic capacitance C43 provided in the region in which the power source wiring line 44 (second power source wiring line) and the first electrode 43a overlap with each other can compensate for the supply of the electric charges mutually between the positive power source AVDD and the negative power source AVSS for the analog circuit. The structural positional relation between the positive power source AVDD and the negative power source AVSS for the analog circuit is not limited to the mode illustrated in FIGS. 7, 8, and 9, and the structural positional relation between the positive power source AVDD and the negative power source AVSS for the analog circuit may be reversed.

Voltage fluctuation of the positive power source AVDD and the negative power source AVSS for the analog circuit can thereby be reduced.

As described above, the display device 1 in the first embodiment includes the display region 11a on which images are displayed using the pixels Pix, the driver ICs 5 provided in the frame region 11b on the outer side of the display region 11a and configured to drive the pixels Pix, the first power source wiring lines (power source wiring lines 41 and 43) and the second power source wiring lines (power source wiring lines 42 and 44) for supplying the power source signals to the driver ICs 5, the first electrodes 41a and 43a that are arranged so as to face the first power source wiring lines (power source wiring lines 41 and 43) and the second power source wiring lines (power source wiring lines 42 and 44) with the first insulating layer (insulating layer 58c) interposed therebetween and are electrically coupled to the first power source wiring lines (power source wiring lines 41 and 43).

With the above-mentioned configuration, the electrostatic capacitances C21 and C43 provided in the regions in which the second power source wiring lines (power source wiring lines 42 and 44) and the first electrodes 41a and 43a overlap with each other can compensate for the supply of the electric charges mutually between the power sources (the positive power source VDD for the logic circuit and the positive power source AVDD for the analog circuit) to be supplied to the first power source wiring lines (power source wiring lines 41 and 43) and the power sources (the negative power source VSS for the logic circuit and the negative power source AVSS for the analog circuit) to be supplied to the second power source wiring lines (power source wiring lines 42 and 44). Power source voltage fluctuation can thereby be reduced even when a large voltage load is instantaneously applied to the inside of each driver IC 5. Furthermore, the width of the frame region 11b on the lower side of the display region 11a can be reduced, thereby contributing to the frame narrowing of the display device 1.

The display device 1 further includes the second electrodes 42a and 44a that are arranged so as to face the first electrodes 41a and 43a with the second insulating layer (insulating layer 58a) interposed therebetween and are coupled to the second power source wiring lines (power source wiring lines 42 and 44). With this configuration, the combined electrostatic capacitances of the electrostatic capacitances C21 and C43 provided in the regions in which the second power source wiring lines (power source wiring lines 42 and 44) and the first electrodes 41a and 43a overlap with each other and the electrostatic capacitances C12 and C34 provided in the regions in which the first electrodes 41a and 43a and the second electrodes 42a and 44a overlap with each other can compensate for the supply of the electric charges mutually between the power sources (the positive power source VDD for the logic circuit and the positive power source AVDD for the analog circuit) to be supplied to the first power source wiring lines (power source wiring lines 41 and 43) and the power sources (the negative power source VSS for the logic circuit and the negative power source AVSS for the analog circuit) to be supplied to the second power source wiring lines (power source wiring lines 42 and 44). Power source voltage fluctuation can thereby be further reduced.

The embodiment can provide a display device capable of making the power source voltage stable.

Second Embodiment

Figure 10:
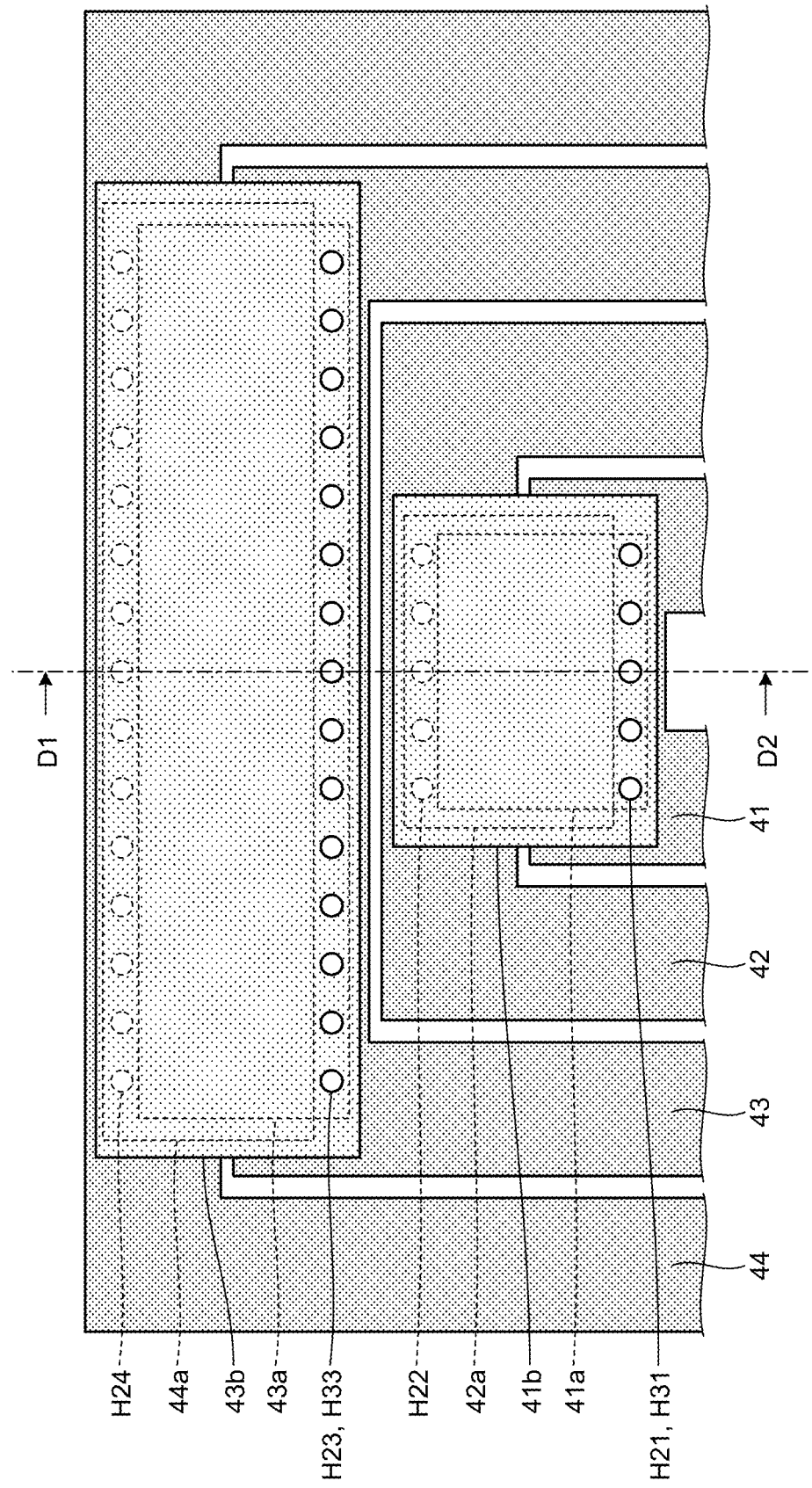
FIG. 10 is a plan view illustrating an example of a power source wiring unit in a second embodiment.
Figure 11:
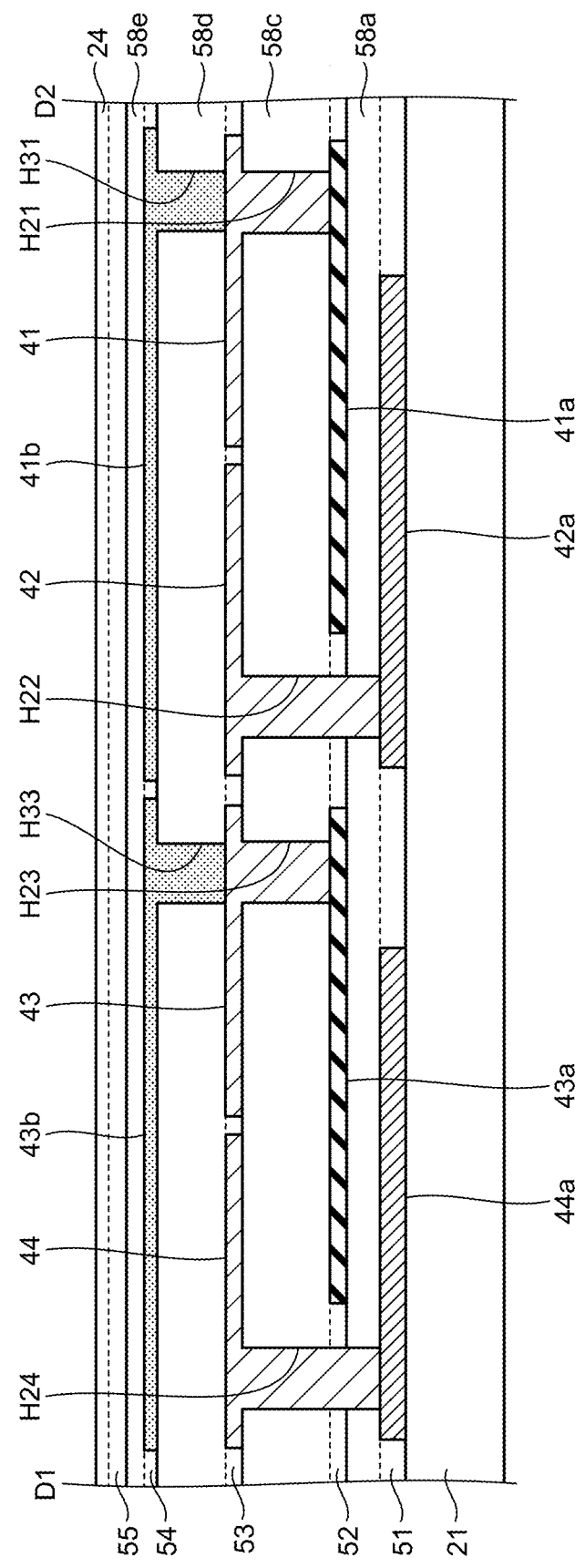
FIG. 11 is a sectional view cut along line D1-D2 in FIG. 10.
Figure 12:
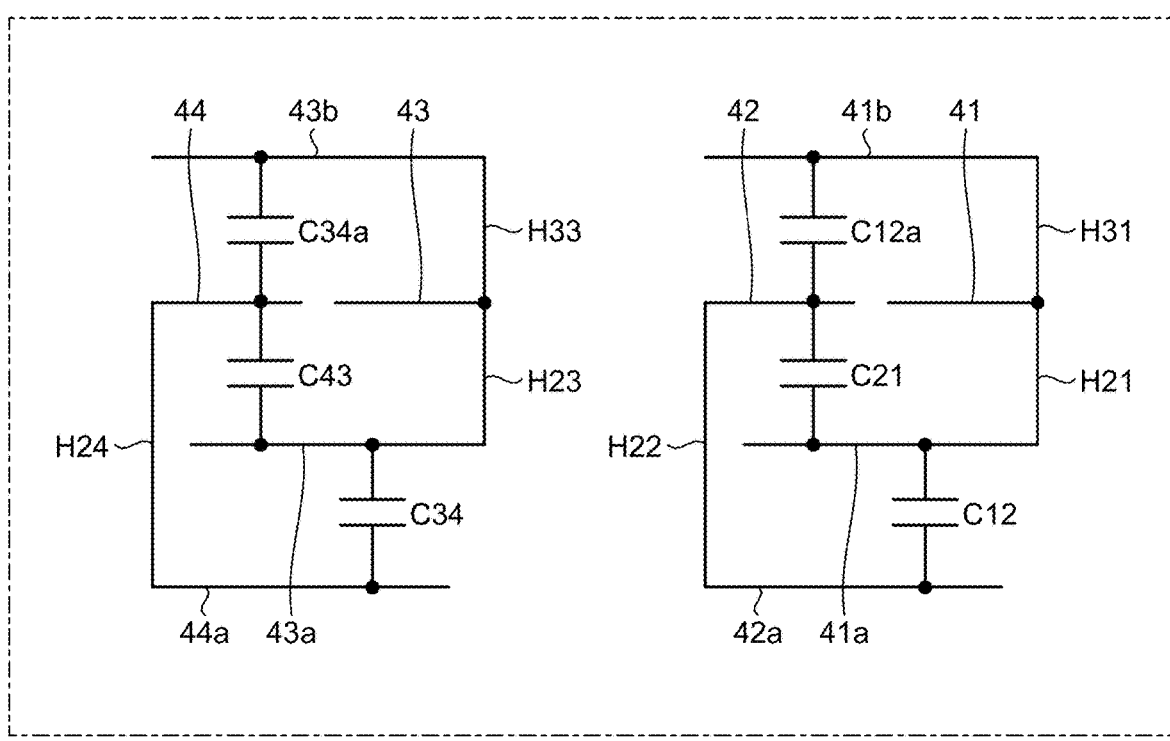
FIG. 12 is an equivalent circuit diagram of the power source wiring unit illustrated in FIG. 10.

FIG. 10 is a plan view illustrating an example of a power source wiring unit in a second embodiment. FIG. 11 is a sectional view cut along line D1-D2 in FIG. 10. FIG. 12 is an equivalent circuit diagram of the power source wiring unit illustrated in FIG. 10. Overlapped explanation of components that are equivalent to or the same as those described in the above-mentioned first embodiment is omitted.

First, a relation between the positive power source VDD and the negative power source VSS for the logic circuit will be described.

The embodiment is different from the first embodiment in the following point. That is, as illustrated in FIG. 11, a third electrode 41b that is arranged in the auxiliary wiring layer 54 so as to face the power source wiring line 41 (first power source wiring line) and the power source wiring line 42 (second power source wiring line) with the insulating layer 58d (third insulating layer) interposed therebetween is provided and is coupled to the power source wiring line 41 (first power source wiring line) through contact holes H31. The third electrode 41b is provided in a region overlapping with the driver IC 5. An electrostatic capacitance C12a is thereby provided in a region in which the third electrode 41b and the power source wiring line 42 (second power source wiring line) overlap with each other, as illustrated in FIG. 12.

With the above-mentioned configuration, a combined electrostatic capacitance of the electrostatic capacitance C21, the electrostatic capacitance C12, and an electrostatic capacitance C12a is provided between the positive power source VDD and the negative power source VSS for the logic circuit. Supply of electric charges can thereby be mutually compensated between the positive power source VDD and the negative power source VSS for the logic circuit. The structural positional relation between the positive power source VDD and the negative power source VSS for the logic circuit is not limited to the mode illustrated in FIGS. 10, 11, and 12, and the structural positional relation between the positive power source VDD and the negative power source VSS for the logic circuit may be reversed.

Voltage fluctuation of the positive power source VDD and the negative power source VSS for the logic circuit can thereby be reduced more than in the first embodiment.

Then, a relation between the positive power source AVDD and the negative power source AVSS for the analog circuit will be described.

The embodiment is different from the first embodiment in the following point. That is, as illustrated in FIG. 11, a third electrode 43b that is arranged in the auxiliary wiring layer 54 so as to face the power source wiring line 43 (first power source wiring line) and the power source wiring line 44 (second power source wiring line) with the insulating layer 58d (third insulating layer) interposed therebetween is provided and is coupled to the power source wiring line 43 (first power source wiring line) through contact holes H33. The third electrode 43b is provided in a region overlapping with the driver IC 5. An electrostatic capacitance C34a is thereby provided in a region in which the third electrode 43b and the power source wiring line 44 (second power source wiring line) overlap with each other, as illustrated in FIG. 12.

With the above-mentioned configuration, a combined electrostatic capacitance of the electrostatic capacitance C43, the electrostatic capacitance C34, and an electrostatic capacitance C34a is provided between the positive power source AVDD and the negative power source AVSS for the analog circuit. Supply of electric charges can thereby be mutually compensated between the positive power source AVDD and the negative power source AVSS for the analog circuit. The structural positional relation between the positive power source AVDD and the negative power source AVSS for the analog circuit is not limited to the mode illustrated in FIGS. 10, 11, and 12, and the structural positional relation between the positive power source AVDD and the negative power source AVSS for the analog circuit may be reversed.

Voltage fluctuation of the positive power source AVDD and the negative power source AVSS for the analog circuit can thereby be reduced more than in the first embodiment.

As described above, in the second embodiment, the display device 1 further includes the third electrodes 41b and 43b that are arranged so as to face the first power source wiring lines (power source wiring lines 41 and 43) and the second power source wiring lines (power source wiring lines 42 and 44) with the third insulating layer (insulating layer 58d) interposed therebetween and are coupled to the first power source wiring lines (power source wiring lines 41 and 43). With this configuration, the combined electrostatic capacitances of the electrostatic capacitances C21 and C43 provided in the regions in which the second power source wiring lines (power source wiring lines 42 and 44) and the first electrodes 41a and 43a overlap with each other, the electrostatic capacitances C12 and C34 provided in the regions in which the first electrodes 41a and 43a and the second electrodes 42a and 44a overlap with each other, and the electrostatic capacitances C12a and C34a provided in the regions in which the third electrodes 41b and 43b and the second power source wiring lines (power source wiring lines 42 and 44) overlap with each other can compensate for the supply of the electric charges mutually between the power sources (the positive power source VDD for the logic circuit and the positive power source AVDD for the analog circuit) to be supplied to the first power source wiring lines (power source wiring lines 41 and 43) and the power sources (the negative power source VSS for the logic circuit and the negative power source AVSS for the analog circuit) to be supplied to the second power source wiring lines (power source wiring lines 42 and 44). Power source voltage fluctuation can thereby be reduced more than in the first embodiment.

The embodiment can provide a display device capable of making the power source voltage stable. Considering that the third electrodes 41a and 43b are used for making the electrostatic capacitances with the first electrodes 41 and 43, the electrostatic capacitances can be arranged at a region other than a place under the driver IC 5.

Third Embodiment

Figure 13:
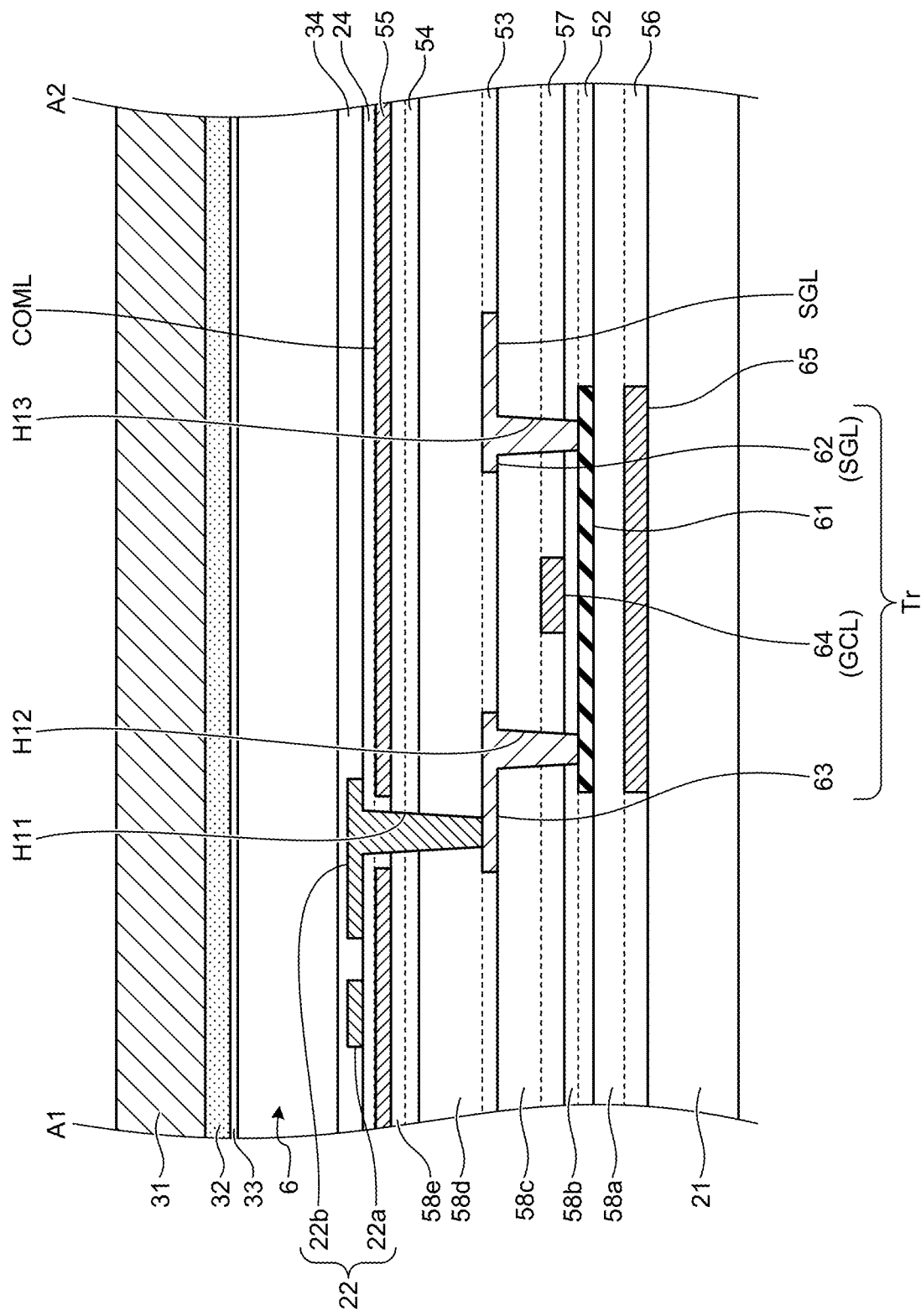
FIG. 13 is a sectional view cut along line A1-A2 in FIG. 4 in a third embodiment.
Figure 14:
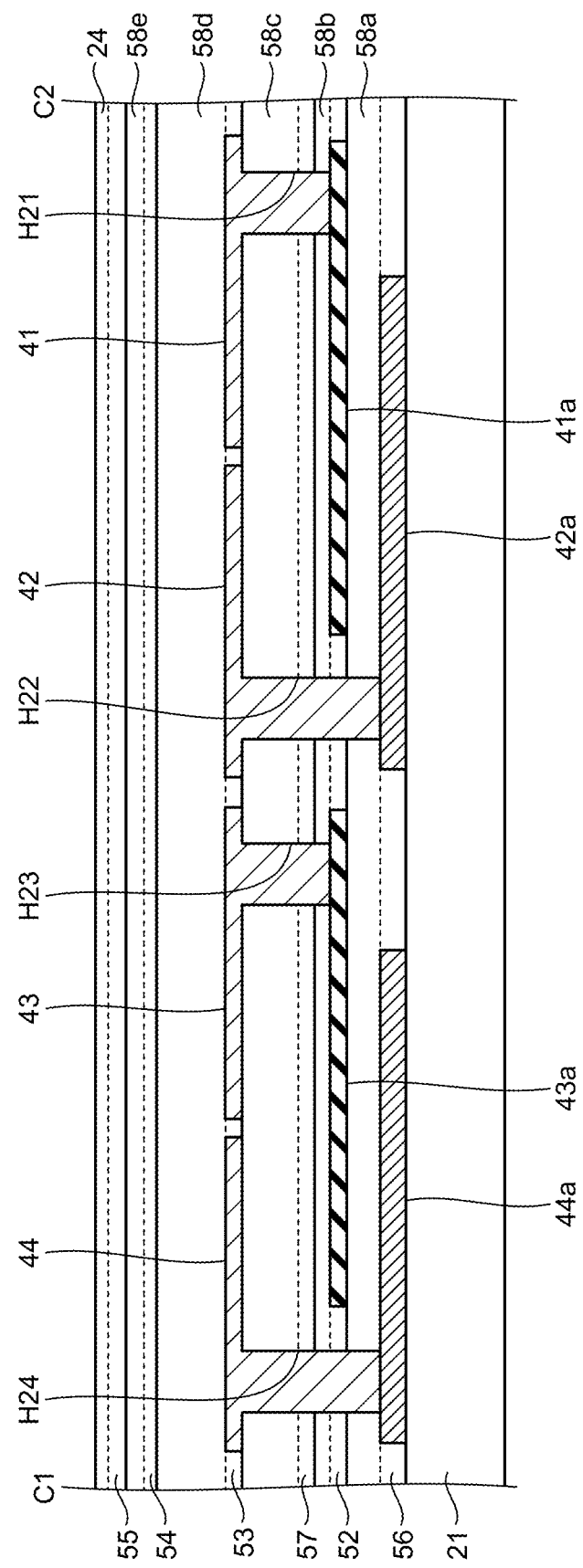
FIG. 14 is a sectional view cut along line C1-C2 in FIG. 7 in the third embodiment.

FIG. 13 is a sectional view cut along line A1-A2 in FIG. 4 in a third embodiment. FIG. 14 is a sectional view cut along line C1-C2 in FIG. 7 in the third embodiment. A plan view (corresponding to FIG. 4 in the first embodiment) illustrating an example of the configuration of a pixel in the third embodiment, a plan view (corresponding to FIG. 7 in the first embodiment) illustrating an example of a power source wiring unit in the third embodiment, and an equivalent circuit diagram (corresponding to FIG. 9 in the first embodiment) of the power source wiring unit in the third embodiment are similar to those in the first embodiment, and explanation thereof is therefore omitted herein. Overlapped explanation of components that are equivalent to or the same as those described in the above-mentioned first embodiment is omitted.

As illustrated in FIG. 13, a light shielding layer 56 is provided above the first substrate 21 in the embodiment. Light shielding films 65 are provided in the light shielding layer 56. The insulating layer 58a is provided above the light shielding layer 56. The semiconductor layer 52 is provided above the insulating layer 58a. The semiconductors 61 are provided in the semiconductor layer 52. The gate electrodes 64 (gate lines GCL) are provided in a gate line layer 57 provided above the semiconductor layer 52 with the insu-lating layer 58b interposed therebetween. The signal line layer 53 is provided with the insulating layer 58c (first insulating layer) interposed. The drain electrodes 63 and the source electrodes 62 (signal lines SGL) are provided in the signal line layer 53. The auxiliary wiring layer 54 is provided above the drain electrodes 63 and the source electrodes 62 (signal lines SGL) with the insulating layer 58d (third insulating layer) interposed therebetween. The common electrode layer 55 is provided above the auxiliary wiring layer 54 with the insulating layer 58e interposed therebetween. The common electrodes COML are provided in the common electrode layer 55. The configuration in which the auxiliary wiring layer and the common electrode layer overlap with each other with no insulating layer interposed therebetween can also be employed. The pixel electrodes 22 are provided above the common electrode layer 55 with the insulating layer 24 interposed therebetween.

A well-known insulating material can be used as a material of the insulating layer 58b. For example, tetra ethyl ortho silicate (TEOS) can be used as the material of the insulating layer 58b.

The light shielding films 65 overlapping with the semiconductors 61 are provided in the light shielding layer 56 in the embodiment. The light shielding films 65 preferably have areas that are larger than those of the semiconductors 61. The light shielding films 65 shield light incident on the semiconductors 61 from the backlight.

As illustrated in FIG. 14, the second electrode 42a and the second electrode 44a are provided in the light shielding layer 56 in the embodiment. Even with such a configuration, the electrostatic capacitance C21 is provided in the region in which the power source wiring line 42 (second power source wiring line) and the first electrode 41a overlap with each other, and the electrostatic capacitance C12 is provided in the region in which the first electrode 41a and the second electrode 42a overlap with each other, similarly to the first embodiment. With the above-mentioned configuration, a combined electrostatic capacitance of the electrostatic capacitance C21 and the electrostatic capacitance C12 is provided between the positive power source VDD and the negative power source VSS for the logic circuit. Supply of electric charges can thereby be mutually compensated between the positive power source VDD and the negative power source VSS for the logic circuit.

A mode in which the second electrode 42a is not configured in the light shielding layer 56 may be employed. In this case, the electrostatic capacitance C21 provided in the region in which the power source wiring line 42 (second power source wiring line) and the first electrode 41a overlap with each other can compensate for the supply of the electric charges mutually between the positive power source VDD and the negative power source VSS for the logic circuit. The structural positional relation between the positive power source VDD and the negative power source VSS for the logic circuit is not limited to the mode illustrated in FIG. 14, and the structural positional relation between the positive power source VDD and the negative power source VSS for the logic circuit may be reversed.

Voltage fluctuation of the positive power source VDD and the negative power source VSS for the logic circuit can thereby be reduced.

The electrostatic capacitance C43 is provided in the region in which the power source wiring line 44 (second power source wiring line) and the first electrodes 43a overlap with each other, and the electrostatic capacitance C34 is provided in the region in which the first electrode 43a and the second electrodes 44a overlap with each other, similarly to the first embodiment.

With the above-mentioned configuration, a combined electrostatic capacitance of the electrostatic capacitance C43 and the electrostatic capacitance C34 is provided between the positive power source AVDD and the negative power source AVSS for the analog circuit. Supply of electric charges can thereby be mutually compensated between the positive power source AVDD and the negative power source AVSS for the analog circuit.

A mode in which the second electrode 44a is not configured in the light shielding layer 56 may be employed. In this case, the electrostatic capacitance C43 provided in the region in which the power source wiring line 44 (second power source wiring line) and the first electrode 43a overlap with each other can compensate for the supply of the electric charges mutually between the positive power source AVDD and the negative power source AVSS for the analog circuit. The structural positional relation between the positive power source AVDD and the negative power source AVSS for the analog circuit is not limited to the mode illustrated in FIG. 14, and the structural positional relation between the positive power source AVDD and the negative power source AVSS for the analog circuit may be reversed.

Voltage fluctuation of the positive power source AVDD and the negative power source AVSS for the analog circuit can thereby be reduced.

Fourth Embodiment

Figure 15:
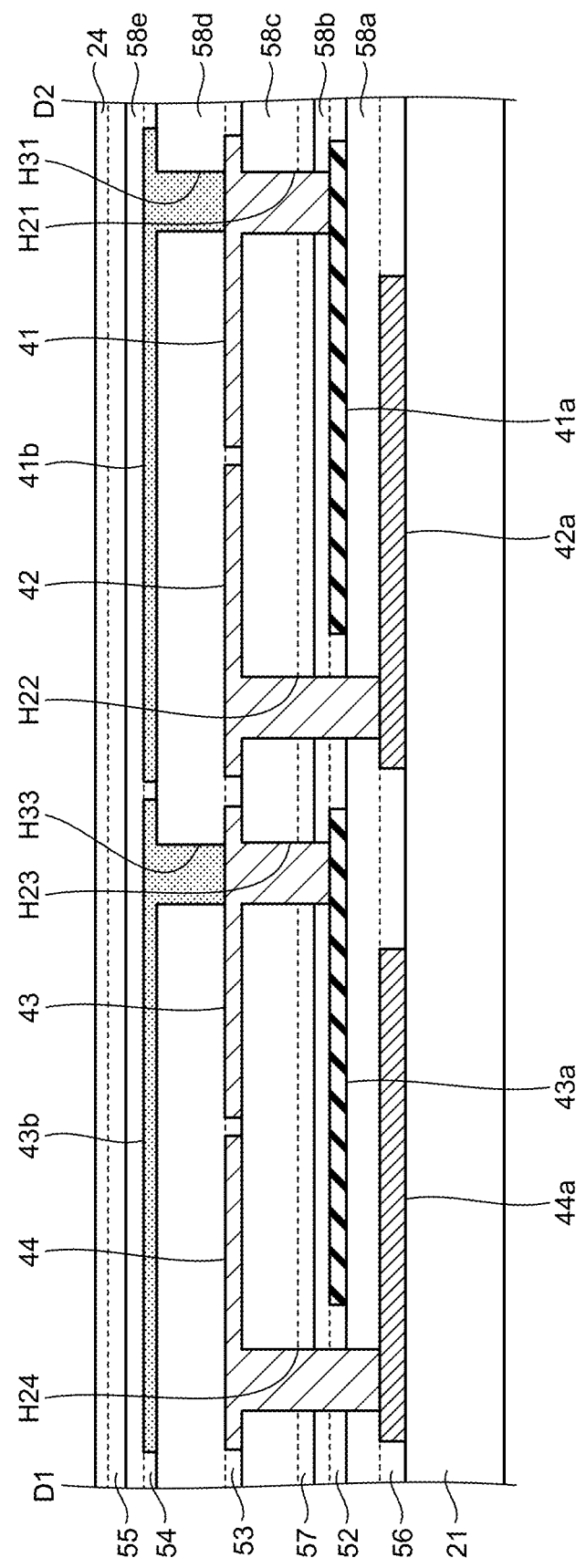
FIG. 15 is a sectional view cut along line C1-C2 in FIG. 7 in a fourth embodiment.

FIG. 15 is a sectional view cut along line C1-C2 in FIG. 7 in a fourth embodiment. A sectional view (corresponding to FIG. 13 in the third embodiment) cut along line A1-A2 in FIG. 4 in the fourth embodiment, a plan view (corresponding to FIG. 4 in the first embodiment) illustrating an example of the configuration of a pixel in the fourth embodiment, a plan view (corresponding to FIG. 10 in the second embodiment) illustrating an example of a power source wiring unit in the fourth embodiment, and an equivalent circuit diagram (corresponding to FIG. 12 in the second embodiment) of the power source wiring unit in the fourth embodiment are similar to those in the embodiments described above, and explanation thereof is therefore omitted herein. Overlapped explanation of components that are equivalent to or the same as those described in the above-mentioned embodiments is omitted.

As illustrated in FIG. 15, in the embodiment, the second electrode 42a and the second electrode 44a are provided in the light shielding layer 56 similarly to the third embodiment. Even with this configuration, the electrostatic capacitance C12a is provided in a region in which the third electrode 41b and the power source wiring line 42 (second power source wiring line) overlap with each other, similarly to the second embodiment.

With the above-mentioned configuration, a combined electrostatic capacitance of the electrostatic capacitance C21, the electrostatic capacitance C12, and the electrostatic capacitance C12a is provided between the positive power source VDD and the negative power source VSS for the logic circuit. Supply of electric charges can thereby be mutually compensated between the positive power source VDD and the negative power source VSS for the logic circuit. The structural positional relation between the positive power source VDD and the negative power source VSS for the logic circuit is not limited to the mode illustrated in FIG. 15, and the structural positional relation between the positive power source VDD and the negative power source VSS for the logic circuit may be reversed.

Voltage fluctuation of the positive power source VDD and the negative power source VSS for the logic circuit can thereby be reduced more than in the first embodiment.

The electrostatic capacitance C34a is provided in a region in which the third electrode 43b and the power source wiring line 44 (second power source wiring line) overlap with each other, similarly to the second embodiment.

With the above-mentioned configuration, a combined electrostatic capacitance of the electrostatic capacitance C43, the electrostatic capacitance C34, and the electrostatic capacitance C34a is provided between the positive power source AVDD and the negative power source AVSS for the analog circuit. Supply of electric charges can thereby be mutually compensated between the positive power source AVDD and the negative power source AVSS for the analog circuit. The structural positional relation between the positive power source AVDD and the negative power source AVSS for the analog circuit is not limited to the mode illustrated in FIG. 15, and the structural positional relation between the positive power source AVDD and the negative power source AVSS for the analog circuit may be reversed.

Voltage fluctuation of the positive power source AVDD and the negative power source AVSS for the analog circuit can thereby be reduced more than in the first embodiment.

Although, as examples, the contact holes H21, H22, H23, H24, H31, and H33 are provided in the above-mentioned embodiments, the number of each of the contact holes H21, H22, H23, H24, H31, and H33 may be one or may be a plural number different from that in the drawings in the embodiments.

Although, as examples, the first power source wiring lines (power source wiring lines 41 and 43) and the second power source wiring lines (power source wiring lines 42 and 44) are provided in the signal line layer 53, the first electrodes 41a and 43a are provided in the semiconductor layer 52, the second electrodes 42a and 44a are provided in the gate line layer 51, and the third electrodes 41b and 43b are provided in the auxiliary wiring layer 54 in the above-mentioned embodiments, the disclosure is not limited thereto. The first power source wiring lines (power source wiring lines 41 and 43), the second power source wiring lines (power source wiring lines 42 and 44), the first electrodes 41a and 43a, the second electrodes 42a and 44a, or the third electrodes 41b and 43b may be provided in a layer different from the layers illustrated in FIG. 15.

The electrostatic capacitance is provided between the positive power source VDD and the negative power source VSS for the logic circuit and the electrostatic capacitance is provided between the positive power source AVDD and the negative power source AVSS for the analog circuit as the example in the above-mentioned embodiments. Alternatively, for example, a mode in which an electrostatic capacitance is provided between the positive power source VDD for the logic circuit and the positive power source AVDD for the analog circuit may be employed, or a mode in which an electrostatic capacitance is provided between the negative power source VSS for the logic circuit and the negative power source AVSS for the analog circuit may be employed. Furthermore, a mode in which an electrostatic capacitance is provided between the positive power source VDD for the logic circuit and the negative power source AVSS for the analog circuit may be employed, or a mode in which an electrostatic capacitance is provided between the negative power source VSS for the logic circuit and the positive power source AVDD for the analog circuit may be employed. Moreover, a mode in which an electrostatic capacitance is provided between each power source and a reference potential may be employed. Effects of the embodiments can be provided with a mode in which the electrodes are provided in a layer different from that of the power source wiring lines and the electrostatic capacitance is provided in a region in which the power source wiring line and the electrode overlap with each other or a region in which the electrodes overlap with each other.

Although the preferred embodiments of the present disclosure have been described above, the present disclosure is not limited by these embodiments. Contents disclosed in the embodiments are merely examples, and various modifications can be made in a range without departing from the gist of the present disclosure. It is needless to say that appropriate modifications in a range without departing from the gist of the present disclosure belong to the technical range of the present disclosure.

What is claimed is:

1. A display device comprising:
   a substrate;
   a display region having a plurality of pixels that are arranged on the substrate;
   a driver IC provided in a frame region on an outer side of the display region and configured to drive the pixels;
   a first power source wiring line and a second power source wiring line each electrically coupled to the driver IC; and
   a first electrode that is arranged so as to overlap the first power source wiring line via a first insulating layer in a plan view and the second power source wiring line via the first insulating layer in a plan view, and is electrically coupled to the first power source wiring line, wherein
   a layer of the first electrode is different from a layer of the first power source wiring line and a layer of the second power source wiring line,
   the first electrode is arranged between the substrate and the first power source wiring line, and between the substrate and the second power source wiring line, and
   the first electrode is electrically coupled to the driver IC via the first power source wiring line, and is provided in a region overlapping with the driver IC.

2. The display device according to claim 1, further comprising a second electrode that is arranged so as to overlap the first electrode via a second insulating layer in a plan view, and is electrically coupled to the second power source wiring line.

3. The display device according to claim 2, wherein the second electrode is provided in a region overlapping with the driver IC.

4. The display device according to claim 1, wherein
   the pixels include pixel transistors, and
   drain electrodes and source electrodes of the pixel transistors are provided in the same layer as the first power source wiring line and the second power source wiring line.

5. The display device according to claim 2, wherein
   the pixels include pixel transistors, and
   gate electrodes of the pixel transistors are provided in the same layer as the second electrode.

6. The display device according to claim 2, wherein
   the pixels include pixel transistors, and
   drain electrodes and source electrodes of the pixel transistors are provided in the same layer as the first power source wiring line and the second power source wiring line, and gate electrodes of the pixel transistors are provided in the same layer as the second electrode.

7. The display device according to claim 2, wherein
   the pixels include pixel transistors and light shielding films provided so as to face semiconductors of the pixel transistors,
   the semiconductors of the pixel transistors are provided in the same layer as the first electrode, and
   the light shielding films are provided in the same layer as the second electrode.

8. The display device according to claim 1, further comprising a third electrode that is arranged so as to face the first power source wiring line and the second power source wiring line via a third insulating layer, and is electrically coupled to the first power source wiring line.

9. The display device according to claim 8, wherein
   the pixels include pixel electrodes and common electrodes provided so as to face the pixel electrodes, and
   wiring lines for supplying drive signals to the common electrodes are provided in the same layer as the third electrode.

10. The display device according to claim 8, wherein the third electrode is provided in a region overlapping with the driver IC.

11. The display device according to claim 1, wherein
    the display region has upper and lower sides extending in a first direction and right and left sides extending in a second direction orthogonal to the first direction, and the driver IC is provided along the lower side,
    a terminal portion that is electrically coupled to the driver IC through at least the first power source wiring line and the second power source wiring line is provided at a position separated from the driver IC in the second direction, and
    the driver IC and the terminal portion are arranged in a staggered manner in the first direction.

12. The display device according to claim 11, wherein a plurality of first pads aligned side by side in the first direction and coupled to the driver IC are provided at positions on which the driver IC overlaps, the terminal portion includes a plurality of second pads aligned side by side in the first direction, the first pads and the second pads are coupled to each other in a correspondence manner through wiring lines including the first power source wiring line and the second power source wiring line, and a distance between the first pads and the second pads corresponding to each other in the second direction is smaller than a distance between the first pads and the second pads in the first direction.

* * * * *